(12) United States Patent
Freer et al.

(10) Patent No.: US 8,555,903 B2
(45) Date of Patent: Oct. 15, 2013

(54) METHOD AND APPARATUS FOR REMOVING CONTAMINATION FROM SUBSTRATE

(75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US); Clint Thomas, Milpitas, CA (US); John Parks, Hercules, CA (US)

(73) Assignee: Lam Research Corporation, Fremont, CA (US)

( * ) Notice: Subject to any disclaimer, the term of this patent is extended or adjusted under 35 U.S.C. 154(b) by 511 days.

(21) Appl. No.: 12/620,288

(22) Filed: Nov. 17, 2009

(65) Prior Publication Data

US 2010/0059088 A1    Mar. 11, 2010

Related U.S. Application Data

(60) Division of application No. 11/336,215, filed on Jan. 20, 2006, now Pat. No. 7,648,584, which is a continuation-in-part of application No. 10/608,871, filed on Jun. 27, 2003, now abandoned.

(60) Provisional application No. 60/755,377, filed on Dec. 30, 2005.

(51) Int. Cl.
  *B08B 3/00*      (2006.01)

(52) U.S. Cl.
  USPC .............. 134/184; 134/93; 15/3.5; 15/104.92

(58) Field of Classification Search
  None
  See application file for complete search history.

(56) References Cited

U.S. PATENT DOCUMENTS

| 3,751,297 | A | * | 8/1973 | Minbiole et al. | 134/30 |
| 4,669,230 | A | * | 6/1987 | Suzuki et al. | 451/2 |
| 5,226,969 | A | * | 7/1993 | Watanabe et al. | 134/7 |
| 5,641,895 | A | * | 6/1997 | Grant | 73/64.56 |
| 6,527,870 | B2 | * | 3/2003 | Gotkis | 134/6 |

* cited by examiner

*Primary Examiner* — Eric Golightly
(74) *Attorney, Agent, or Firm* — Martine Penilla Group, LLP

(57) ABSTRACT

A cleaning material is disposed over a substrate. The cleaning material includes solid components dispersed within a liquid medium. A force is applied to the solid components within the liquid medium to bring the solid components within proximity to contaminants present on the substrate. The force applied to the solid components can be exerted by an immiscible component within the liquid medium. When the solid components are brought within sufficient proximity to the contaminants, an interaction is established between the solid components and the contaminants. Then, the solid components are moved away from the substrate such that the contaminants having interacted with the solid components are removed from the substrate.

20 Claims, 7 Drawing Sheets

METHOD AND APPARATUS FOR REMOVING CONTAMINATION FROM SUBSTRATE

CLAIM OF PRIORITY

This application is a divisional application of U.S. patent application Ser. No. 11/336,215, filed on Jan. 20, 2006, now U.S. Pat. No. 7,648,584 which claims the benefit of U.S. Provisional Application No. 60/755,377, filed Dec. 30, 2005, and which is a continuation-in-part of U.S. patent application Ser. No. 10/608,871, filed Jun. 27, 2003 now abandoned. The disclosure of each of the above-identified patent applications is incorporated herein by reference in its entirety.

CROSS REFERENCE TO RELATED APPLICATIONS

This application is related to U.S. patent application Ser. No. 10/816,337, filed on Mar. 31, 2004, and entitled "Apparatuses and Methods for Cleaning a Substrate," and U.S. patent application Ser. No. 11/173,132, filed on Jun. 30, 2005, and entitled "System and Method for Producing Bubble Free Liquids for Nanometer Scale Semiconductor Processing," and U.S. patent application Ser. No. 11/153,957, filed on Jun. 15, 2005, and entitled "Method and Apparatus for Cleaning a Substrate Using Non-Newtonian Fluids," and U.S. patent application Ser. No. 11/154,129, filed on Jun. 15, 2005, and entitled "Method and Apparatus for Transporting a Substrate Using Non-Newtonian Fluid," and U.S. patent application Ser. No. 11/174,080, filed on Jun. 30, 2005, and entitled "Method for Removing Material from Semiconductor Wafer and Apparatus for Performing the Same," and U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology.

SUMMARY

In one embodiment, a method is disclosed for removing contamination from a substrate. The method includes an operation for disposing a cleaning material over a substrate. The cleaning material includes a number of solid components dispersed within a liquid medium. The method also includes an operation for applying a force to a solid component to bring the solid component within proximity to a contaminant present on the substrate, such that an interaction is established between the solid component and the contaminant. The method further includes an operation for moving the solid component away from the substrate, such that the contaminant that interacted with the solid component is removed from the substrate.

In another embodiment, an apparatus for removing contamination from a substrate is disclosed. The apparatus includes a channel for receiving a substrate. The channel is defined to include a constraining surface positioned in an opposing and substantially parallel orientation with respect to a surface of the substrate from which contamination is to be removed. The apparatus also includes a cleaning material disposed within the channel such that the substrate to be received by the channel is submerged within the cleaning material. The cleaning material is defined as a liquid medium including dispersed solid components. The apparatus further includes an immiscible component generator disposed within the channel to generate immiscible components within the cleaning material. The immiscible components are generated within the cleaning material such that a motive force is applied to move the immiscible components between the constraining surface of the channel and the surface of the substrate from which contamination is to be removed.

In another embodiment, a method is disclosed for removing contamination from a substrate. The method includes an operation for submerging a substrate in a cleaning material such that a surface of the substrate from which contamination is to be removed is positioned in an opposing and substantially parallel orientation with respect to a constraining surface. The cleaning material is defined to include solid components dispersed within a liquid medium. The method also includes an operation for tilting the substrate together with the constraining surface relative to a horizontal plane. The method further includes an operation for generating immiscible components within the cleaning material at a location corresponding to an elevation lower than the substrate. A buoyant force acting upon the immiscible components causes the immiscible components to move over the substrate and between the constraining surface and the substrate. Movement of the immiscible components over the substrate causes a force to be applied to the solid components within the liquid medium, such that the solid components interact with contaminants present on the substrate.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
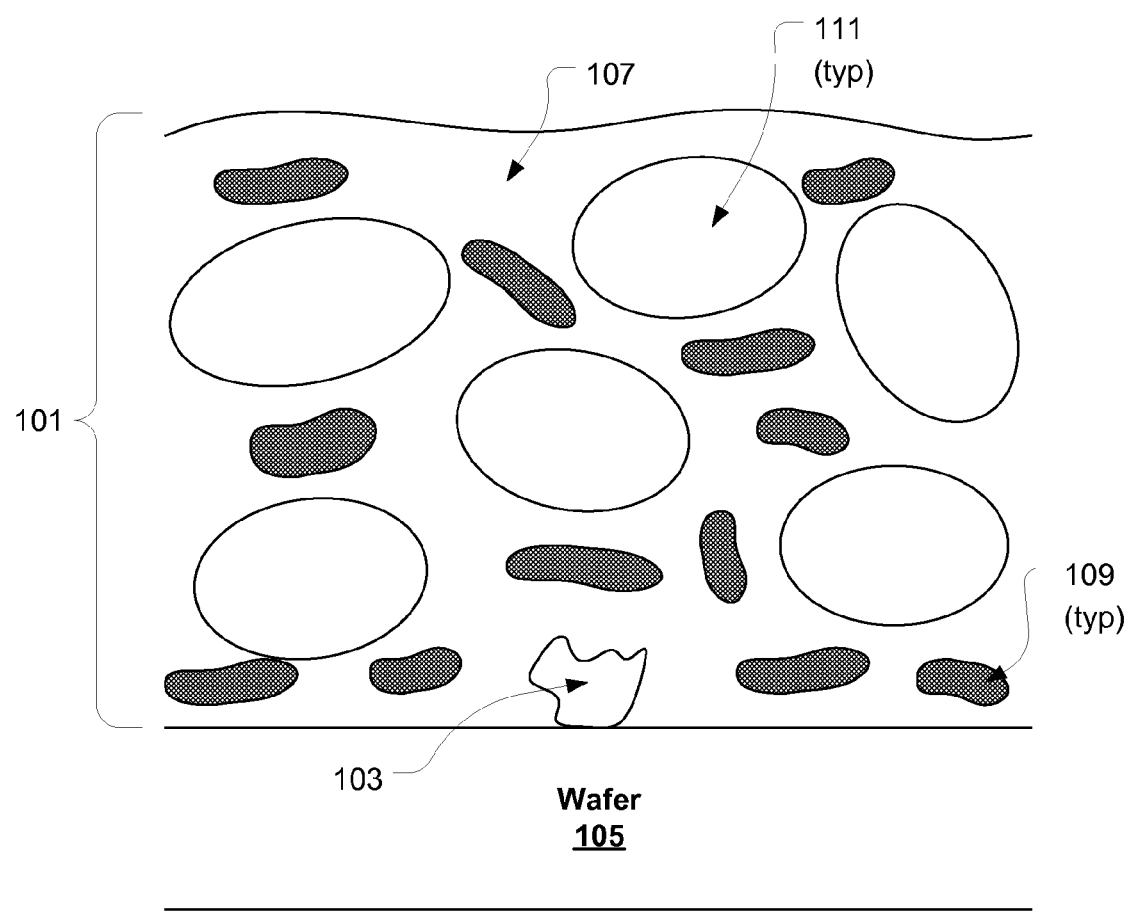
FIG. 1 is an illustration showing a physical diagram of a cleaning material for removing contamination from a semiconductor wafer, in accordance with one embodiment of the present invention.

FIG. 1 is an illustration showing a physical diagram of a cleaning material 101 for removing contamination 103 from a semiconductor wafer ("wafer") 105, in accordance with one embodiment of the present invention. The cleaning material 101 of the present invention includes a continuous liquid medium 107, solid components 109, and immiscible components 111. The solid components 109 and immiscible components 111 are dispersed within the continuous liquid medium 107. In various embodiments, the continuous liquid medium 107 can be either aqueous or non-aqueous. Depending on the particular embodiment, the immiscible components 111 can be defined in either a gas phase, a liquid phase, a solid phase, or a combination of gas, liquid, and solid phases. In one embodiment, the immiscible components 111 are defined as a mixture of immiscible components 111, wherein each immiscible component 111 within the mixture has either a common physical state or a different physical state. For example, in various embodiments the physical states of immiscible components 111 within the mixture of immiscible components 111 can include a gas and a liquid, a gas and a solid, a liquid and a solid, or any combination of multiple gases, multiple liquids, and multiple solids.

It should be appreciated that the immiscible components 111 are immiscible with respect to the continuous liquid medium 107. In one exemplary embodiment, the immiscible components 111 are defined as gas bubbles within the continuous liquid medium 107. In another exemplary embodiment, the immiscible components 111 are defined as liquid droplets within the continuous liquid medium 107. Regardless of the particular embodiment associated with the continuous liquid medium 107 and immiscible components 111, the solid components 109 are dispersed in suspension within the continuous liquid medium 107.

It should be understood that depending on the particular embodiment, the solid components 109 within the cleaning material 101 may posses physical properties representing essentially any sub-state within the solid phase, wherein the solid phase is defined as a phase other than liquid or gas. For example, physical properties such as elasticity and plasticity can vary among different types of solid components 109 within the cleaning material 101. Additionally, it should be understood that in various embodiments the solid components 109 can be defined as crystalline solids or non-crystalline solids. Regardless of their particular physical properties, the solid components 109 within the cleaning material 101 should be capable of avoiding adherence to the wafer 105 surface when positioned in either close proximity to or contact with the wafer 105 surface. Additionally, the mechanical properties of the solid components 109 should not cause damage to the wafer 105 surface during the cleaning process. Furthermore, the solid components 109 should be capable of establishing an interaction with the contaminant 103 material present on the wafer 105 surface when positioned in either close proximity or contact with the contaminant 103. For example, the size and shape of the solid components 109 should be favorable for establishing the interaction between the solid components 109 and the contaminants 103.

The solid components 109 within the cleaning material 101 should be capable of interacting with contaminants 103 on the wafer 105 while avoiding both adhesion and damage to the wafer 105. Also, the solid components 109 should avoid dissolution in the liquid medium 107 and should have a surface functionality that enables dispersion throughout the liquid medium 107. For solid components 109 that do not have surface functionality that enables dispersion throughout the liquid medium 107, chemical dispersants may be added to the liquid medium 107 to enable dispersion of the solid components 109. Depending on their specific chemical characteristics and their interaction with the surrounding liquid medium 107, the solid components 109 may take one or more of several different forms. For example, in various embodiments the solid components 109 may form aggregates, colloids, gels, coalesced spheres, or essentially any other type of agglutination, coagulation, flocculation, agglomeration, or coalescence. It should be appreciated that the exemplary list solid component 109 forms identified above is not intended to represent an inclusive list. In other embodiments, the solid components 109 may take a form not specifically identified herein. Therefore, the point to understand is that the solid components 109 can be defined as essentially any solid material capable of functioning in the manner previously described with respect to their interaction with the wafer 105 and the contaminants 103.

Some exemplary solid components 109 include aliphatic acids, carboxylic acids, paraffin, wax, polymers, polystyrene, polypeptides, and other visco-elastic materials. The solid component 109 material should be present at a concentration that exceeds its solubility limit within the liquid medium 107. Also, it should be understood that the cleaning effectiveness associated with a particular solid component 109 material may vary as a function of temperature.

The aliphatic acids represent essentially any acid defined by organic compounds in which carbon atoms form open chains. A fatty acid is an example of an aliphatic acid that can be used as the solid components 109 within the cleaning material 101. Examples of fatty acids that may be used as the solid components 109 include capric acid, lauric acid, palmitic acid, myristic acid, stearic acid, oleic acid, arachidic acid, behenic acid, lignoceric acid, and cerotic acid, among others. In one embodiment, the solid components 109 can represent a mixture of fatty acids defined by various carbon chain lengths extending from C-1 to about C-26. Carboxylic acids are defined by essentially any organic acid that includes one or more carboxyl groups (COOH). When used as the solid components 109, the carboxylic acids can include mixtures of various carbon chain lengths extending from C-1 through about C-100. Also, the carboxylic acids can include long-chain alcohols, ethers, and/or ketones, above the solubility limit in the liquid medium 107.

In some embodiments, addition of a dispersant material to the liquid medium 107 may be required to enable a particular type of solid component 109, such as a fatty acid, to disperse throughout the liquid medium 107. For example, a base can be added to the liquid medium 107 to enable suspension of solid components 109 fowled from materials such as carboxylic acid or stearic acid that are present in less than stoichiometric quantities. Additionally, the surface functionality of the solid component 109 materials can be influenced by the inclusion of moieties that are miscible with the liquid medium 107, such as carboxylate, phosphate, sulfate groups, polyol groups, ethylene oxide, etc. The point to be understood is that the solid components 109 should be dispersible in a substantially uniform manner throughout the liquid medium 107 such that the solid components 109 avoid clumping together into a form that cannot be forced to interact with the contaminants 103 present on the wafer 105.

As previously mentioned, the continuous liquid medium 107 can be either aqueous or non-aqueous. For example, an aqueous liquid medium 107 can be defined by de-ionized water in one embodiment. In another embodiment, a non-aqueous liquid medium 107 can be defined by a hydrocarbon, a fluorocarbon, a mineral oil, or an alcohol, among others. Irrespective of whether the liquid medium 107 is aqueous or non-aqueous, it should be understood that the liquid medium 107 can be modified to include ionic or non-ionic solvents and other chemical additives. For example, the chemical additives to the liquid medium 107 can include any combination of co-solvents, pH modifiers, chelating agents, polar solvents, surfactants, ammonia hydroxide, hydrogen peroxide, hydrofluoric acid, tetramethylammonium hydroxide, and rheology modifiers such as polymers, particulates, and polypeptides.

As previously mentioned, the immiscible components 111 within the cleaning material 101 can be defined in either the gas phase, the liquid phase, the solid phase, or a combination thereof. In the embodiment having the immiscible components 111 defined in the gas phase, the immiscible components 111 are defined as gas bubbles dispersed throughout the continuous liquid medium 107. In one embodiment, the gas bubbles are defined to occupy 5% to 99.9% of the cleaning material 101 by volume. In another embodiment, the gas bubbles are defined to occupy 50% to 95% of the cleaning material 101 by weight. The gas defining the immiscible components 111 can be either inert, e.g., $N_2$, Ar, etc., or reactive, e.g., $O_2$, $O_3$, $H_2O_2$, air, $H_2$, $NH_3$, HF, etc.

In the embodiment having the immiscible components 111 defined in the liquid phase, the immiscible components 111 are defined as liquid droplets dispersed throughout the continuous liquid medium 107, wherein the liquid droplets are immiscible within the liquid medium 107. The liquid defining the immiscible components 111 can be either inert or reactive. For example, hexane or mineral oil may be used as an inert liquid for defining the immiscible components 111, wherein the liquid medium 107 is aqueous. In another example, oil soluble surface modifiers may be used as a reactive liquid for defining the immiscible components 111.

During the cleaning process, a downward force is exerted on the solid components 109 within the liquid medium 107 such that the solid components 109 are brought within close proximity or contact with the contaminants 103 on the wafer 105. The immiscible components 111 within the cleaning material 101 provide the mechanism by which the downward force is exerted on the solid components 109. When the solid component 109 is forced within sufficient proximity to or contact with the contaminant 103, an interaction is established between the solid component 109 and the contaminant 103. The interaction between the solid component 109 and the contaminant 103 is sufficient to overcome an adhesive force between the contaminant 103 and the wafer 105. Therefore, when the solid component 109 is moved away from the wafer 105, the contaminant 103 that interacted with the solid component 109 is also moved away from the wafer 105, i.e., the contaminant 103 is cleaned from the wafer 105.

Figure 2A:
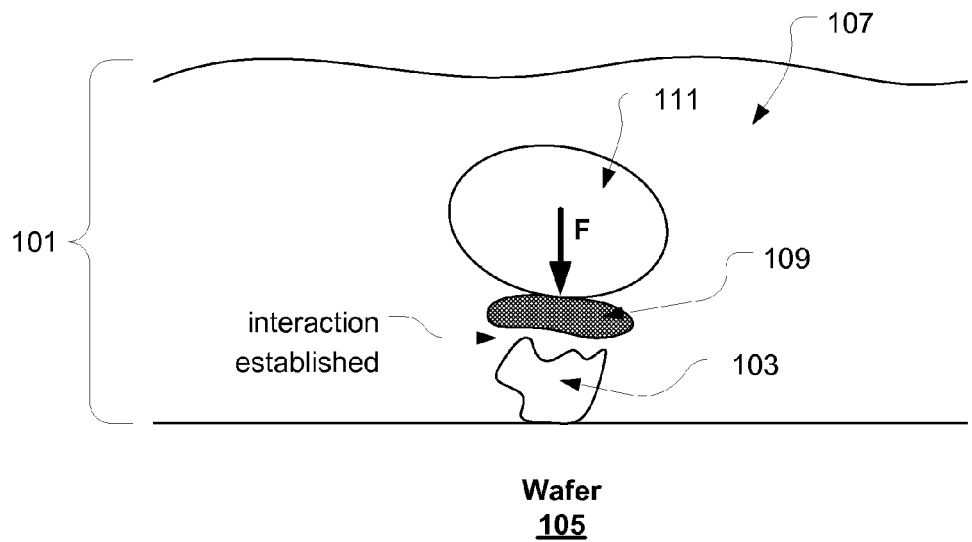
FIGS. 2A-2B are illustrations showing how the cleaning material functions to remove the contaminant from the wafer, in accordance with one embodiment of the present invention.
Figure 2B:
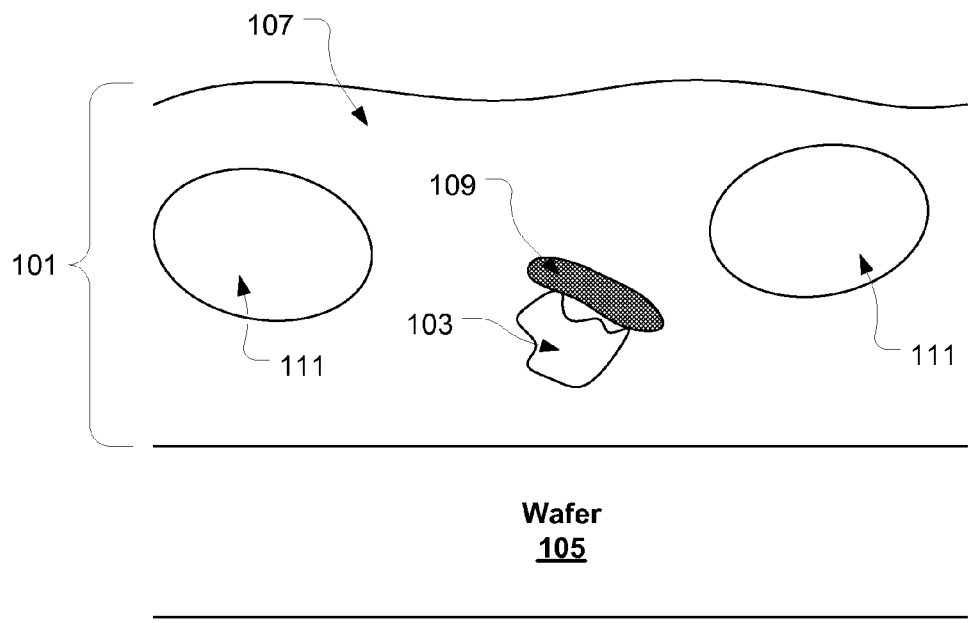

FIGS. 2A-2B are illustrations showing how the cleaning material 101 functions to remove the contaminant 103 from the wafer 105, in accordance with one embodiment of the present invention. It should be understood that the cleaning material 101 depicted in FIGS. 2A-2B possesses the same characteristics as previously described with respect to FIG. 1. As shown in FIG. 2A, within the liquid medium 107 of the cleaning material 101, the solid component 109 is interposed between the contaminant 103 and the immiscible component 111. The immiscible component 111 within the liquid medium, whether gas bubbles or liquid droplets, has an associated surface tension. Therefore, when the immiscible component 111 is pressed downward against the solid component 109, the immiscible component 111 becomes deformed and exerts a downward force (F) on the solid component 109. This downward force (F) serves to move the solid component 109 toward the wafer 105 and contaminant 103 thereon. In one embodiment, the interaction between the solid component 109 and contaminant 103 occurs when the solid component 109 is forced sufficiently close to the contaminant 103. In another embodiment, the interaction between the solid component 109 and contaminant 103 occurs when the solid component 109 actually contacts the contaminant 103.

The interaction force between the solid component 109 and the contaminant 103 is stronger than the force connecting the contaminant 103 to the wafer 105. Additionally, in an embodiment where the solid component 109 binds with the contaminant 103, a force used to move the solid component 109 away from the wafer 105 is stronger than the force connecting the contaminant 103 to the wafer 105. Therefore, as depicted in FIG. 2B, when the solid component 109 is moved away from the wafer 105, the contaminant 103 bound to the solid component 109 is also moved away from the wafer 105. It should be appreciated that because the solid components 109 interact with the contamination 103 to affect the cleaning process, contamination 103 removal across the wafer 105 will be dependent on how well the solid components 109 are distributed across the wafer 105. In a preferred embodiment, the solid components 109 will be so well distributed that essentially every contaminant 103 on the wafer 105 will be in proximity to at least one solid component 109. It should also be appreciated that one solid component 109 may come in contact with or interact with more than one contaminant 103, either in a simultaneous manner or in a sequential manner.

Interaction between the solid component 109 and the contaminant 103 can be established through one or more mechanisms including adhesion, collision, and attractive forces, among others. Adhesion between the solid component 109 and contaminant 103 can be established through chemical interaction and/or physical interaction. For example, in one embodiment, chemical interaction causes a glue-like effect to occur between the solid component 109 and the contaminant 103. In another embodiment, physical interaction between the solid component 109 and the contaminant 103 is facilitated by the mechanical properties of the solid component 109. For example, the solid component 109 can be malleable such that when pressed against the contaminant 103, the contaminant 103 becomes imprinted within the malleable solid component 109. In another embodiment, the contaminant 103 can become entangled in a network of solid components 109. In this embodiment, mechanical stresses can be transferred through the network of solid components 109 to the contaminant 103, thus providing the mechanical force necessary for removal of the contaminant 103 from the wafer 105.

Deformation of the solid component 109 due to imprinting by the contaminant 103 creates a mechanical linkage between the solid component 109 and the contaminant 103. For example, a surface topography of the contaminant 103 may be such that as the contaminant 103 is pressed into the solid component 109, portions of the solid component 109 material enters regions within the surface topography of the contaminant 103 from which the solid component 109 material cannot easily escape, thereby creating a locking mechanism. Additionally, as the contaminant 103 is pressed into the solid component 109, a vacuum force can be established to resist removal of the contaminant 103 from the solid component 109.

In another embodiment, energy transferred from the solid component 109 to the contaminant 103 through direct or indirect contact may cause the contaminant 103 to be dislodged from the wafer 105. In this embodiment, the solid component 109 may be softer or harder than the contaminant 103. If the solid component 109 is softer than the contaminant 103, greater deformation of the solid component 109 is likely to occur during the collision, resulting in less transfer of kinetic energy for dislodging the contaminant 103 from the wafer 105. However, in the case where the solid component 109 is softer than the contaminant 103, the adhesive connection between the solid component 109 and the contaminant 103 may be stronger. Conversely, if the solid component 109 is at least as hard as the contaminant 103, a substantially complete transfer of energy can occur between the solid component 109 and the contaminant 103, thus increasing the force that serves to dislodge the contaminant 103 from the wafer 105. However, in the case where the solid component 109 is at least as hard as the contaminant 103, interaction forces that rely on deformation of the solid component 109 may be reduced. It should be appreciated that physical properties and relative velocities associated with the solid component 109 and the contaminant 103 will influence the collision interaction therebetween.

In addition to the foregoing, in one embodiment, interaction between the solid component 109 and contaminant 103 can result from electrostatic attraction. For example, if the solid component 109 and the contaminant 103 have opposite surface charges they will be electrically attracted to each other. It is possible that the electrostatic attraction between the solid component 109 and the contaminant 103 can be sufficient to overcome the force connecting the contaminant 103 to the wafer 105.

In another embodiment, an electrostatic repulsion may exist between the solid component 109 and the contaminant 103. For example, both the solid component 109 and the contaminant 103 can have either a negative surface charge or a positive surface charge. If the solid component 109 and the contaminant 103 can be brought into close enough proximity, the electrostatic repulsion therebetween can be overcome through van der Waals attraction. The force applied by the immiscible component 111 to the solid component 109 may be sufficient to overcome the electrostatic repulsion such that van der Waals attractive forces are established between the solid component 109 and the contaminant 103. Additionally, in another embodiment, the pH of the liquid medium 107 can be adjusted to compensate for surface charges present on one or both of the solid component 109 and contaminant 103, such that the electrostatic repulsion therebetween is reduced to facilitate interaction.

Figure 3:
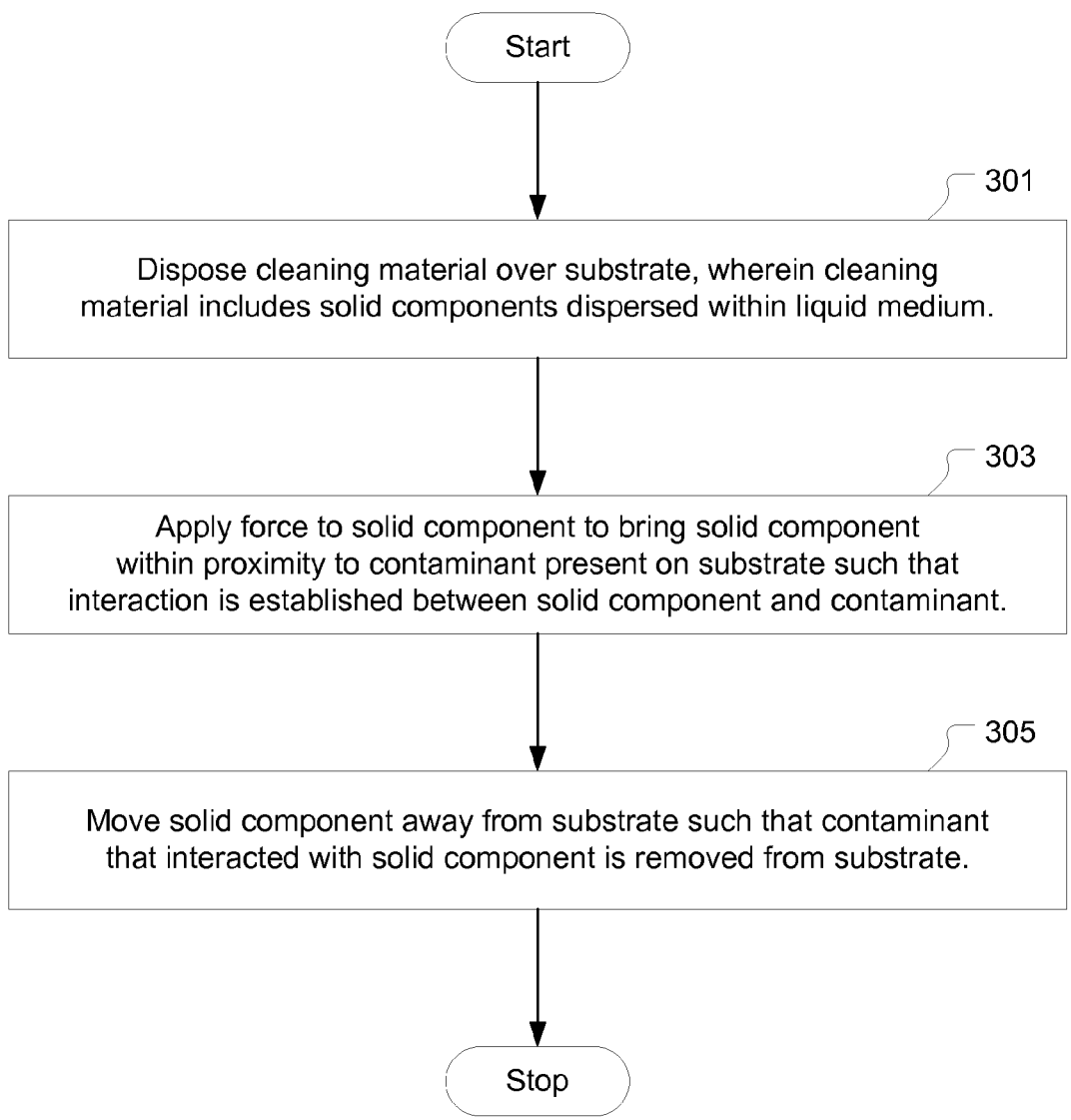
FIG. 3 is an illustration showing a flowchart of a method for removing contamination from a substrate, in accordance with one embodiment of the present invention.

FIG. 3 is an illustration showing a flowchart of a method for removing contamination from a substrate, in accordance with one embodiment of the present invention. It should be understood that the substrate referenced in the method of FIG. 3 can represent a semiconductor wafer or any other type of substrate from which contaminants associated with a semiconductor fabrication process need to be removed. Also, the contaminants referenced in the method of FIG. 3 can represent essentially any type of contaminant associated with the semiconductor wafer fabrication process, including but not limited to particulate contamination, trace metal contamination, organic contamination, photoresist debris, contamination from wafer handling equipment, and wafer backside particulate contamination.

The method of FIG. 3 includes an operation 301 for disposing a cleaning material over a substrate, wherein the cleaning material includes solid components dispersed within a liquid medium. The cleaning material referenced in the method of FIG. 3 is the same as previously described with respect to FIGS. 1, 2A, and 2B. Therefore, the solid components within the cleaning material are dispersed in suspension within the liquid medium. Also, the solid components are defined to avoid damaging the substrate and to avoid adherence to the substrate. In one embodiment, the solid components are defined as crystalline solids. In another embodiment, the solid components are defined as non-crystalline solids. In yet another embodiment, the solid components are represented as a combination of crystalline and non-crystalline solids. Additionally, in various embodiments, the liquid medium can be either aqueous or non-aqueous.

The method also includes an operation 303 for applying a force to a solid component to bring the solid component within proximity to a contaminant present on the substrate, such that an interaction is established between the solid component and the contaminant. As previously discussed, immiscible components are provided within the cleaning material to apply the force to the solid component necessary to bring the solid component within proximity to the contaminant. In one embodiment, the method can include an operation for controlling the immiscible components to apply a controlled amount of force to the solid component. The immiscible components can be defined as gas bubbles or immiscible liquid droplets within the liquid medium. Additionally, the immiscible components can be represented as a combination of gas bubbles and immiscible liquid droplets within the liquid medium.

In one embodiment of the method, the immiscible components are defined within the liquid medium prior to disposing the cleaning material over the substrate. However, in another embodiment, the method can include an operation to form the immiscible components in-situ following disposition of the cleaning material over the substrate. For example, the immiscible components can be formed from a dissolved gas within the liquid medium upon a decrease in ambient pressure relative to the cleaning material. It should be appreciated that formation of the immiscible components in situ may enhance the contamination removal process. For example, in one embodiment, gravity serves to pull the solid components toward the substrate prior to formation of the immiscible components. Then, the ambient pressure is reduced such that gas previously dissolved within the liquid medium comes out of solution to form gas bubbles. Because the solid components have been pulled by gravity toward the substrate, the majority of gas bubbles will form above the solid components. Formation of the gas bubbles above the solid components, with the solid components already settled toward the substrate, will serve to enhance movement of the solid components to within proximity of the contaminants on the substrate.

In various embodiments, the interaction between the solid component and the contaminant can be established by adhesive forces, collision forces, attractive forces, or a combination thereof. Also, in one embodiment, the method can include an operation for modifying a chemistry of the liquid medium to enhance interaction between the solid component and the contaminant. For example, the pH of the liquid medium can be modified to cancel surface charges on one or both of the solid component and contaminant such that electrostatic repulsion is reduced.

Additionally, in one embodiment, the method can include an operation for controlling a temperature of the cleaning material to enhance interaction between the solid component and the contaminant. More specifically, the temperature of the cleaning material can be controlled to control the properties of the solid component. For example, at a higher temperature the solid component may be more malleable such that it conforms better when pressed against the contaminant. Then, once the solid component is pressed and conformed to the contaminant, the temperature is lowered to make the solid component less malleable to better hold its conformal shape relative to the contaminant, thus effectively locking the solid component and contaminant together. The temperature may also be used to control the solubility and therefore the concentration of the solid components. For example, at higher temperatures the solid component may be more likely to dissolve in the liquid medium. The temperature may also be used to control and/or enable formation of solid components in-situ on the wafer from liquid-liquid suspension.

In a separate embodiment, the method can include an operation for precipitating solids dissolved within the continuous liquid medium. This precipitation operation can be accomplished by dissolving the solids into a solvent and then adding a component that is miscible with the solvent but that is immiscible with the solid. Addition of the component that is miscible with the solvent but that is immiscible with the solid causes the precipitation of a solid component.

The method further includes an operation 305 for moving the solid component away from the substrate such that the contaminant that interacted with the solid component is removed from the substrate. In one embodiment, the method includes an operation for controlling a flow rate of the cleaning material over the substrate to control or enhance movement of the solid component and/or contaminant away from the substrate.

Figure 4A:
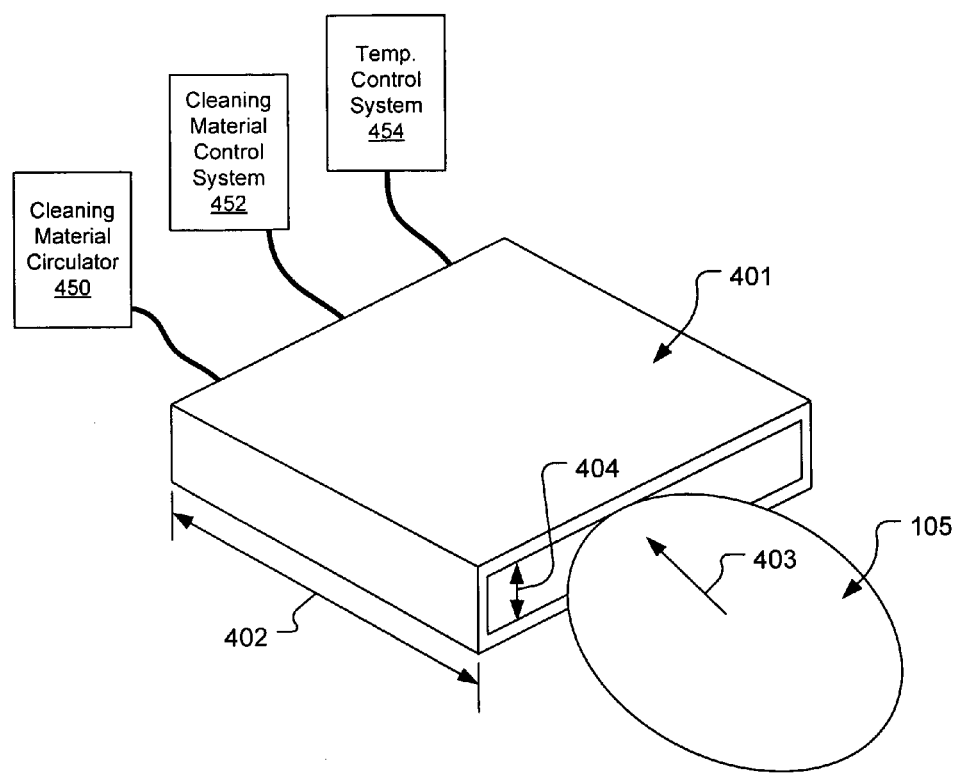
FIG. 4A is an illustration showing an apparatus for removing contamination from a wafer, in accordance with one embodiment of the present invention.

The method of the present invention for removing contamination from a substrate can be implemented in many different ways so long as there is a means for applying a force to the solid components of the cleaning material such that the solid components establish an interaction with the contaminants to be removed. FIG. 4A is an illustration showing an apparatus for removing contamination from a wafer, in accordance with one embodiment of the present invention. The apparatus includes a channel 401 for receiving the wafer 105, as indicated by arrow 403. It should be appreciated that the length 402 and height 404 of the channel 401 interior is defined to accommodate the wafer 105. Also, in one embodiment the height 404 of the channel 401 is adjustable. The channel 401 is defined to contain the cleaning material 101, as previously described. Thus, when the wafer 105 is moved into the channel 401, the wafer 105 is submerged within the cleaning material 101. It should be appreciated that the channel 401 can be made from any material of sufficient strength that is chemically compatible with the cleaning material 101 and wafer 105.

Figure 4B:
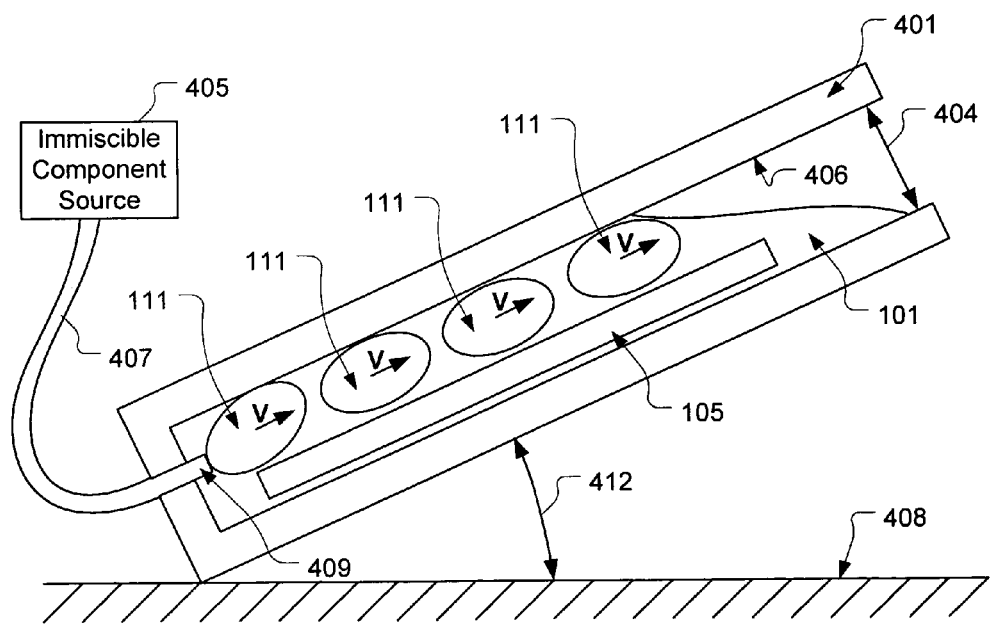
FIG. 4B is an illustration showing a side cross-sectional view of the channel having the wafer disposed therein, in accordance with one embodiment of the present invention.

FIG. 4B is an illustration showing a side cross-sectional view of the channel 401 having the wafer 105 disposed therein, in accordance with one embodiment of the present invention. The channel 401 includes a constraining surface 406 positioned in an opposing and substantially parallel orientation with respect to the surface of the wafer 105 from which contamination is to be removed. The channel 401 and wafer 105 are tilted at an angle 412 with respective to a horizontal plane 408. At a lower end/elevation of the channel 401, an immiscible component generator 409 is provided for generating immiscible components 111 within the liquid medium 107.

As previously discussed, the immiscible components 111 can be formed from either gas or liquid that is immiscible within the liquid medium 107. The immiscible component 111 material is provided from a source 405 through a line 407 to the immiscible component generator 409. During the cleaning operation, a motive force is applied to move the immiscible components 111 over the wafer 105 with a velocity V. It should be appreciated that as the immiscible components 111 are moved over the wafer 105, the position of the immiscible components relative to the wafer 105 is constrained by the constraining surface 406 of the channel 401. In one embodiment, the motive force applied to move the immiscible components 111 over the wafer 105 is a buoyant force. In another embodiment, a dispensing pressure of the immiscible component generator 409 provides the motive force for moving the immiscible components 111 over the wafer 105.

In various embodiments, the immiscible component generator 409 can be configured to have either a single generation point or multiple generation points. For example, in one embodiment, the immiscible component generator 409 is defined as a manifold configured to include a number of immiscible component 111 generation points. Additionally, it should be appreciated that the apparatus can include a substrate holder defined to rotate and/or translate the wafer 105 within the channel during the cleaning process.

Figure 4C:
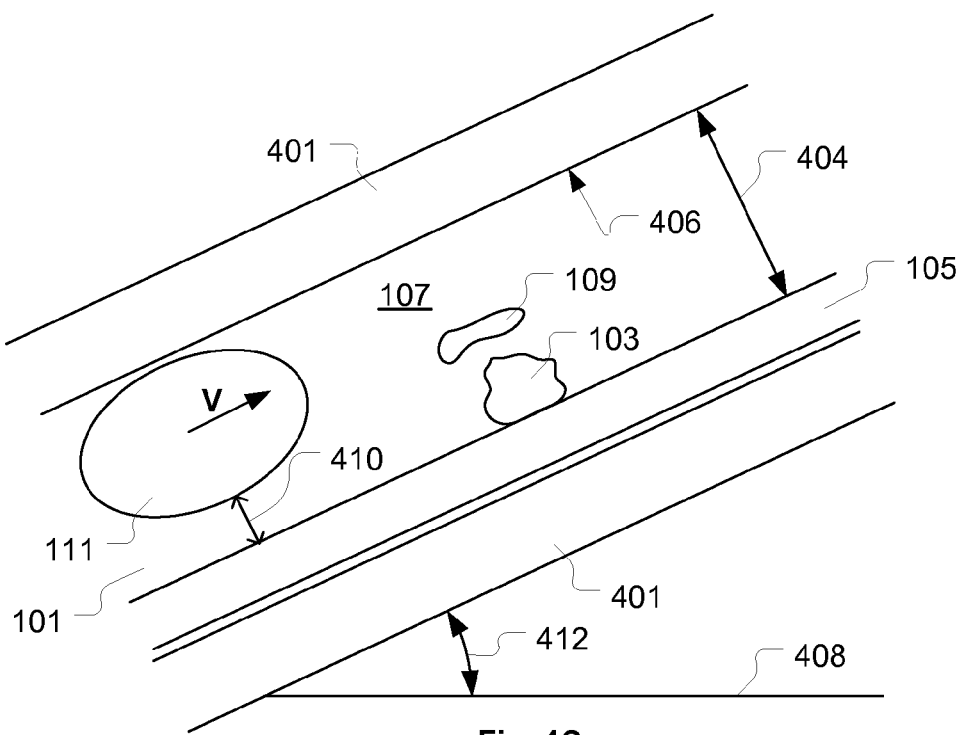
FIG. 4C is an illustration showing a relationship between the immiscible component, the solid component, the contaminant, and the wafer, in accordance with one embodiment of the present invention.

FIG. 4C is an illustration showing a relationship between the immiscible component 111, the solid component 109, the contaminant 103, and the wafer 105. As the immiscible component 111 moves over the wafer 105 surface, a thickness 410 of cleaning material separates the immiscible component-to-liquid medium interface from the wafer 105 surface. It should be appreciated that in the embodiment where buoyant force drives the movement of the immiscible components 111 over the wafer 105, an increase in tilt angle 412 will cause a corresponding increase in the buoyant force. As the buoyant force and corresponding velocity V of the immiscible component 111 increases, the immiscible component 111 can become elongated, thus increasing the cleaning material thickness 410. If the thickness 410 of the cleaning material becomes sufficiently large, the immiscible component 111 may not be capable of exerting a sufficient force on the solid component 109 to enable interaction with the contaminant 103. Also, as the immiscible component 111 velocity V increases, the residency time of the immiscible component 111 at a given location over the wafer 105 surface decreases. Therefore, the tilt angle 412 should be set to appropriately control the immiscible component 111 velocity V. Also, the separation distance 404 between the constraining surface 406 and the wafer 105 should be controlled such that the cleaning material thickness 410 does not become too large.

Figure 4D:
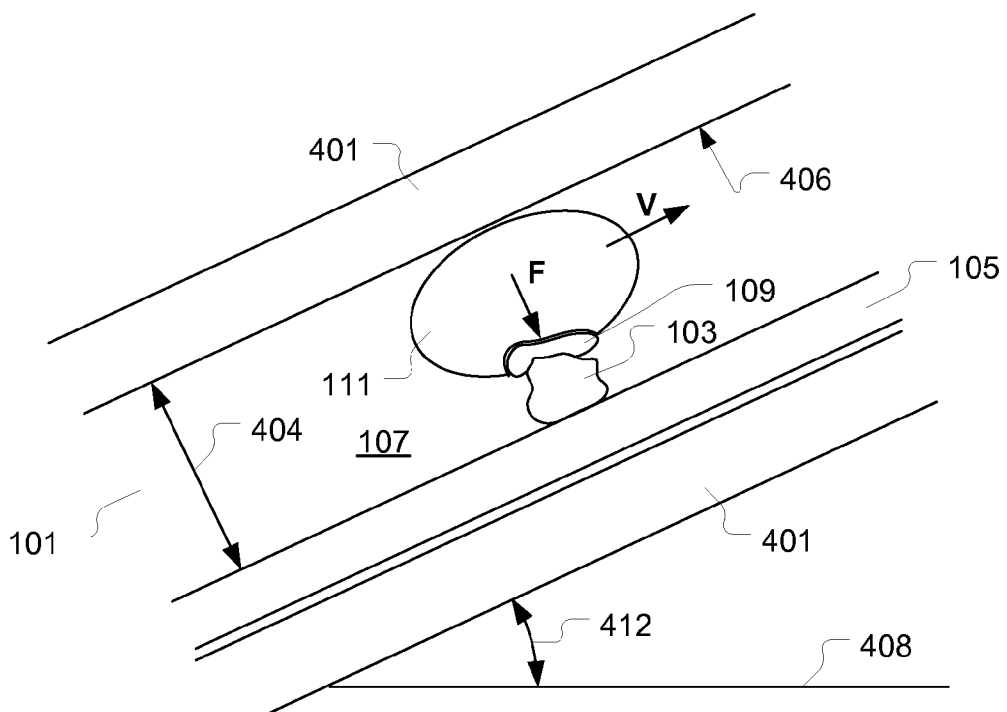
FIG. 4D is an illustration showing how the immiscible component functions to drive the solid component to within proximity of the contaminant, in accordance with one embodiment of the present invention.

FIG. 4D is an illustration showing how the immiscible component 111 functions to drive the solid component 109 to within proximity of the contaminant 103, in accordance with one embodiment of the present invention. As the immiscible component 111 traverses over the solid component 109 and contaminant 103 within the liquid medium 107, the immiscible component forces the solid component 109 toward the contaminant 103 with a force F. As previously discussed, interaction occurs between the solid component 109 and contaminant 103 when they are forced within sufficient proximity to each other. The force F exerted by the immiscible component 111 on the solid component 109 is related to a pressure differential between the immiscible component 111 and the liquid medium 107. Additionally, the contaminant 103 is further exposed to shear stresses within the cleaning material thickness 410. Also, the contaminant 103 is exposed to interfacial forces present at the boundary between the immiscible component 111 and the liquid medium 107. These shear stresses and interfacial forces serve to assist in dislodging the contaminant 103 from the wafer 105 surface.

Figure 4E:
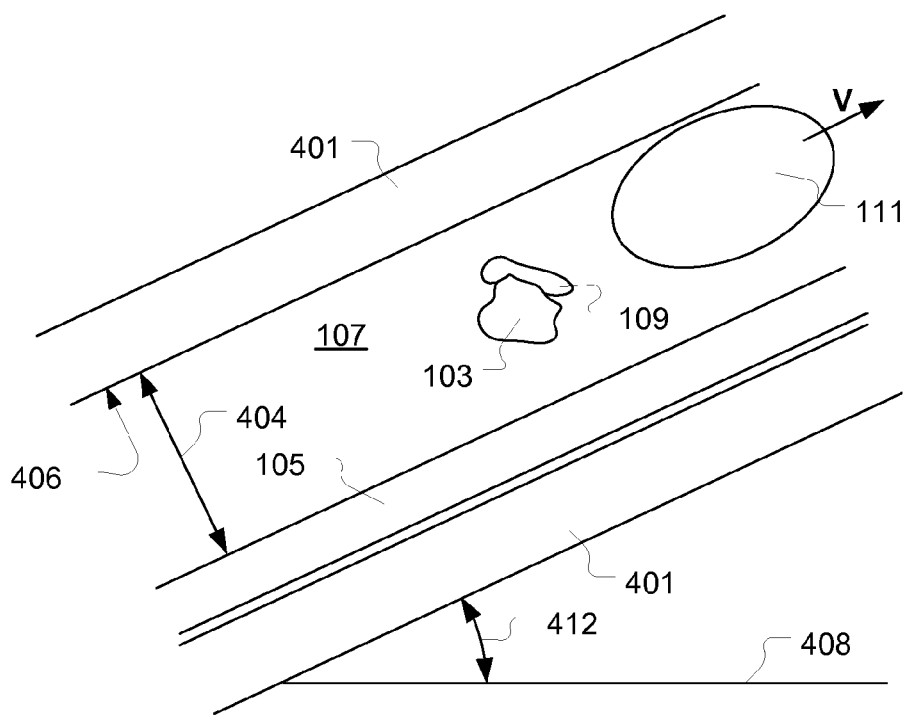
FIG. 4E is an illustration showing the removal of the contaminant from the wafer surface following traversal thereover of the immiscible component, in accordance with one embodiment of the present invention.

FIG. 4E is an illustration showing the removal of the contaminant 103 from the wafer 105 surface following traversal thereover of the immiscible component 111, in accordance with one embodiment of the present invention. In the embodiment of FIG. 4E, the solid component 109 and contaminant 103 are removed from the wafer 105 as a combined unit under the influence of shear stresses and interfacial forces as previously discussed. In another embodiment, the solid component 109 interacts with the contaminant 103 to remove the contaminant 103 from the wafer 105 without actually combining with the contaminant 103. In this embodiment, each of the solid component 109 and the contaminant 103 will individually move away from the wafer 105. In one embodiment, removal of the contaminant 103 from the wafer 105 can be enhanced by shear forces associated with a flow of the cleaning material through the channel 401. In this embodiment, the apparatus can include a cleaning material circulator 450 defined to induce a flow within the cleaning material such that contaminants 103 having interacted with the solid components 109 are moved away from the wafer 105.

Figure 4F:
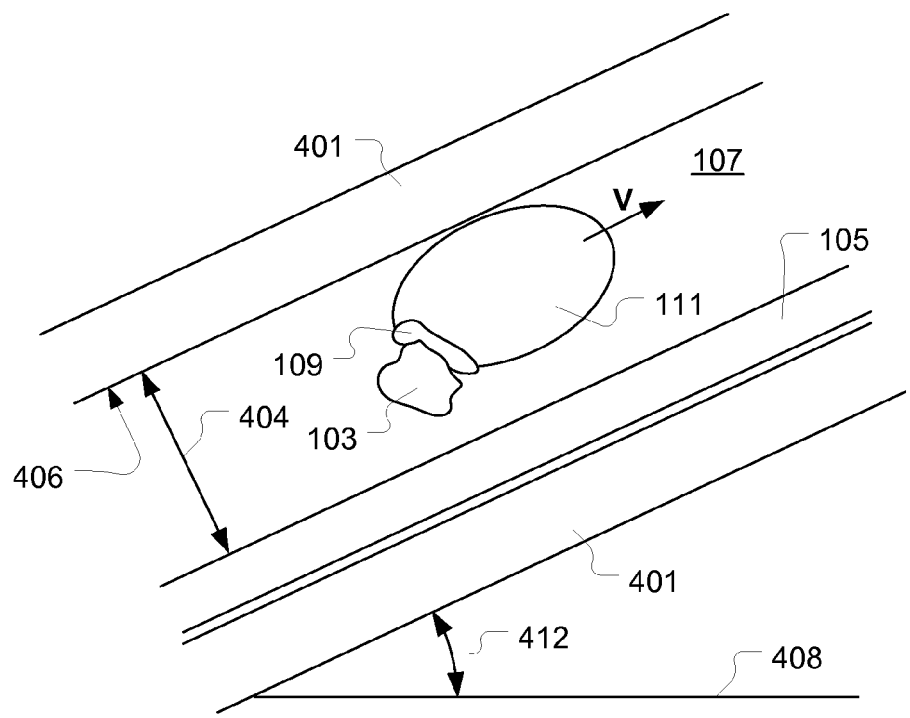
FIG. 4F is an illustration showing the removal of the contaminant from the wafer surface, in accordance with another embodiment of the present invention.

FIG. 4F is an illustration showing the removal of the contaminant 103 from the wafer 105 surface, in accordance with another embodiment of the present invention. In embodiment of FIG. 4F, the liquid medium 107 is aqueous, the immiscible component 111 is non-aqueous, and the solid component 109 is surface active. As the immiscible component 111 traverses over the solid component 109, the immiscible component not only exerts force F on the solid component 109, but also wets the solid component 109, such that the solid component 109 is pulled into the interface region between the immiscible component 111 and the liquid medium 107. Thus, removal of the solid component 109 and contaminant 103 combination from the wafer 105 is enhanced by the adsorption of the solid component 109 to the immiscible-liquids interface.

Although the apparatus of FIGS. 4A-4F has been described with respect to particular exemplary embodiments, it should be appreciated that the principles for removing contaminants from the wafer can be equally applied in other embodiments of the apparatus. For example, the apparatus of FIGS. 4A-4F can be modified to maintain the wafer in a horizontal, vertical, or upside-down orientation so long as a motive force for the immiscible components 111 is provided such that the immiscible components 111 exert the force F on the solid components 109 to enable their interaction with the contaminants 103. Also, in various embodiments, the wafer 105 may be spun, pulled, pushed, or otherwise agitated in conjunction with traversal of the immiscible components 111 over the wafer 105.

Additionally, the cleaning process performed using the apparatus of FIGS. 4A-4F in conjunction with the method of FIG. 3 can be performed in accordance with recipes that prescribe particular control settings for parameters such as temperature, pressure, flow rates, and time. In one embodiment, the apparatus can include a cleaning material control system 452 defined to monitor and adjust a chemistry of the cleaning material to enhance interaction between the solid components 109 and the contaminants 103 and enhance removal of the contaminants 103 from the wafer 105. Also, in one embodiment, the apparatus can include a temperature control system 454 defined to control the temperature of the cleaning material within the channel 401. Furthermore, the cleaning process performed using the apparatus of FIGS. 4A-4F in conjunction with the method of FIG. 3 can be performed in an iterative manner, i.e., multiple step manner. Also, the principles described with respect to the single wafer 105 apparatus of FIGS. 4A-4F can be extended to an apparatus configured to process multiple wafers 105 in a simultaneous manner.

Figure 5:
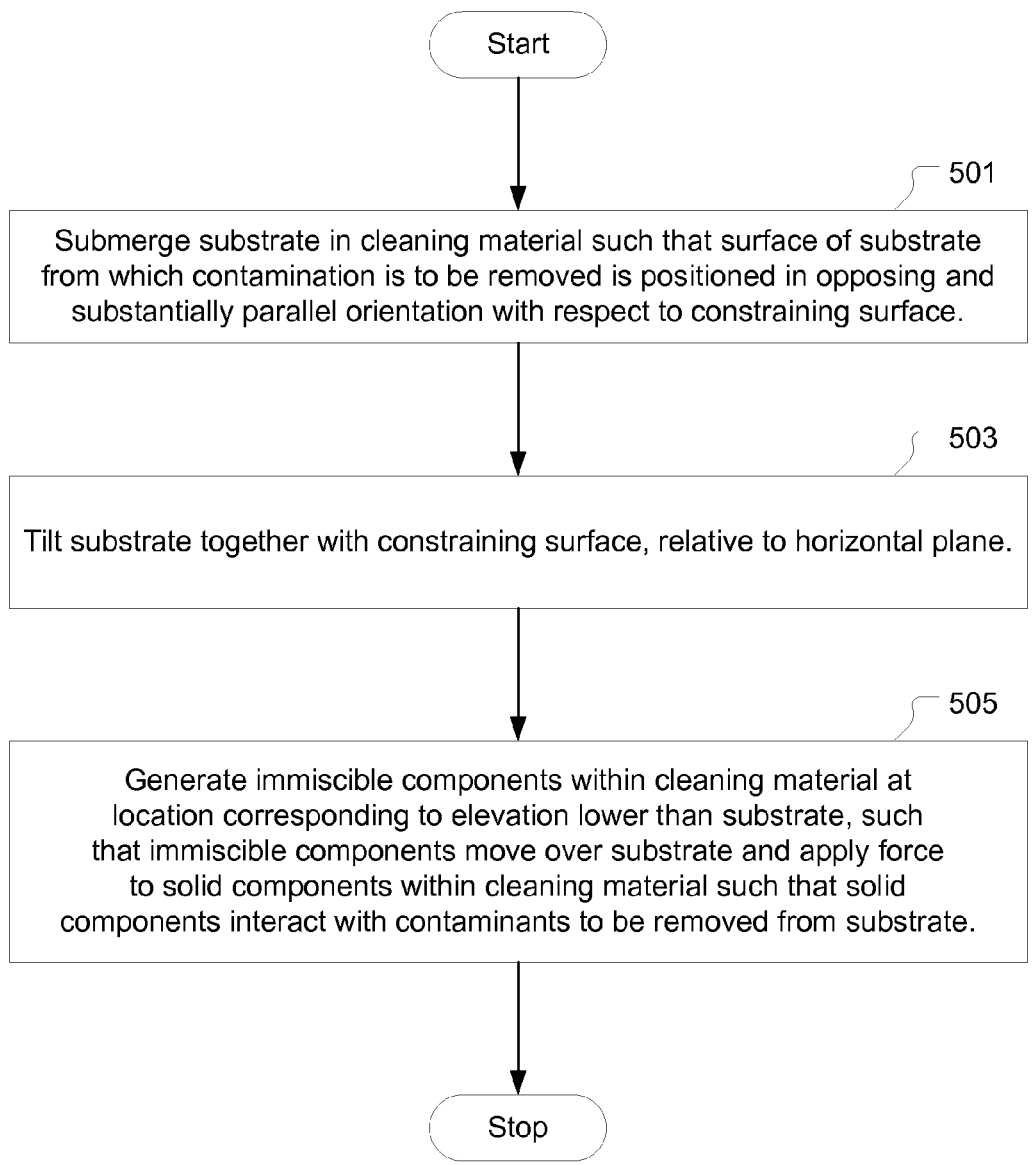
FIG. 5 is an illustration showing a flowchart of a method for removing contamination from a substrate, in accordance with another embodiment of the present invention.

FIG. 5 is an illustration showing a flowchart of a method for removing contamination from a substrate, in accordance with another embodiment of the present invention. The method includes an operation 501 for submerging a substrate in a cleaning material such that a surface of the substrate from which contamination is to be removed is positioned in an opposing and substantially parallel orientation with respect to a constraining surface. FIGS. 4A-4F, as previously discussed, illustrate an example of the substrate being positioned in the opposing and substantially parallel orientation with respect to the constraining surface, while being submerged within the cleaning material. It should be appreciated that the cleaning material referenced in the method of FIG. 5 represents the same cleaning material 101, as previously described. Therefore, the cleaning material includes solid components 109 dispersed within a liquid medium 107.

The method also includes an operation 503 for tilting the substrate together with the constraining surface, relative to a horizontal plane. In various embodiments, the tilting can be performed either before or after positioning of the substrate in the opposing and substantially parallel orientation with the constraining surface. The method further includes an operation 505 for generating immiscible components within the cleaning material at a location corresponding to an elevation lower than the substrate. FIG. 4B, as previously discussed, illustrates an example of the immiscible components 111 being generated within the cleaning material at an elevation lower than that of the substrate, wherein the wafer 105 represents the substrate.

A buoyant force acting upon the immiscible components causes the immiscible components to move over substrate, between the constraining surface and the substrate. Movement of the immiscible components over the substrate causes a force to be applied to the solid components within the liquid medium such that the solid components interact with contaminants present on the substrate. FIGS. 4C-4F, as previously discussed, illustrate an example of how the immiscible components exert force on the solid components to facilitate interaction between the solid components and the contaminants such that the contaminants are removed from the substrate.

The method as described in the flowchart of FIG. 5 can include a number of additional operations to enhance the contamination removal process. In one embodiment, an operation can be included for adjusting an angle of tilt of the substrate together with the constraining surface to enable control of the immiscible component velocity over the substrate. Also, an operation can be included for adjusting a separation distance between the constraining surface and the substrate to enable control of a distance between the immiscible components and the substrate, as the immiscible components move over the substrate.

In another operation, the cleaning material can be circulated to induce a flow of cleaning material over the substrate. It should be appreciated that inducing a flow of cleaning material over the substrate can allow for replenishment of chemical species within the cleaning material and enhance movement of removed contaminants away from the substrate. The method can further include an operation for monitoring and adjusting the cleaning material chemistry to enhance interaction between the solid components and the contaminants, thus enhancing removal of the contaminants from the substrate. Additionally, the temperature of the cleaning material can be monitored and adjusted to enhance interaction between the solid components and the contaminants. It should also be appreciated that an operation can be performed to manipulate the substrate through either rotation, translation, or both rotation and translation, as the immiscible components move over the substrate.

Although the present invention has been described in the context of removing contaminants from a semiconductor wafer, it should be understood that the previously described principles and techniques of the present invention can be equally applied to cleaning surfaces other than semiconductor wafers. For example, the present invention can be used to clean any equipment surface used in semiconductor manufacturing, wherein any equipment surface refers to any surface that is in environmental communication with the wafer, e.g., shares air space with the wafer. The present invention can also be used in other technology areas where contamination removal is important. For example, the present invention can be used to remove contamination on parts used in the space program, or other high technology areas such as surface science, energy, optics, microelectronics, MEMS, flat-panel processing, solar cells, memory devices, etc. It should be understood that the aforementioned listing of exemplary areas where the present invention may be used is not intended to represent an inclusive listing. Furthermore, it should be appreciated that the wafer as used in the exemplary description herein can be generalized to represent essentially any other structure, such as a substrate, a part, a panel, etc.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for removing contamination from a substrate, comprising:
  a channel for receiving a substrate, the channel defined to include a solid non-porous constraining surface positioned in an opposing and substantially parallel orientation with respect to a surface of the substrate, wherein contamination is to be removed from the surface of the substrate;
  a cleaning material disposed within the channel such that the substrate to be received by the channel is submerged within the cleaning material, the cleaning material defined as a liquid medium including dispersed solid components; and
  an immiscible component generator disposed within the channel to generate immiscible components within the cleaning material such that a motive force is applied to move the immiscible components between the solid constraining surface of the channel and the surface of the substrate,
  wherein the solid non-porous constraining surface is defined to constrain a position of the immiscible components relative to the substrate as the immiscible components move between the solid constraining surface and the surface of the substrate.

2. An apparatus for removing contamination from a substrate as recited in claim 1, wherein the immiscible components apply a force to the solid components within the liquid medium to bring the solid components within proximity to contaminants present on the surface of the substrate such that an interaction is established between the solid components and the contaminants.

3. An apparatus for removing contamination from a substrate as recited in claim 1, wherein movement of the immiscible components between the solid non-porous constraining surface of the channel and the surface of the substrate causes the solid components to interact with contaminants on the surface of the substrate so as to remove the interacted with contaminants from the surface of the substrate.

4. An apparatus for removing contamination from a substrate as recited in claim 1, further comprising:
  a cleaning material circulator defined to induce a flow within the cleaning material.

5. An apparatus for removing contamination from a substrate as recited in claim 1, wherein the channel is defined to be positioned at an angle greater than zero with respect to horizontal such that the motive force for moving the immiscible components is a buoyant force.

6. An apparatus for removing contamination from a substrate as recited in claim 1, wherein the channel is defined to enable adjustment of a separation distance between the solid non-porous constraining surface of the channel and the surface of the substrate.

7. An apparatus for removing contamination from a substrate as recited in claim 1, further comprising:
a cleaning material control system defined to monitor and adjust a chemistry of the cleaning material to enhance interaction between the solid components and the contaminants and enhance removal of the contaminants from the surface of the substrate.

8. An apparatus for removing contamination from a substrate as recited in claim 1, further comprising:
a temperature control system defined to control a temperature of the cleaning material within the channel.

9. An apparatus for removing contamination from a substrate as recited in claim 1, wherein the immiscible component generator is defined to generate immiscible components in either a liquid phase or a gas phase.

10. An apparatus for removing contamination from a substrate as recited in claim 1, wherein the immiscible component generator is defined to generate a number of immiscible component trains across the surface of the substrate.

11. An apparatus for removing contamination from a substrate as recited in claim 1, further comprising:
a substrate holder defined to either rotate, translate, or both rotate and translate the substrate within the channel.

12. An apparatus for removing contamination from a substrate as recited in claim 1, wherein the apparatus is defined to remove contamination from multiple substrates in a simultaneous manner.

13. An system for removing contamination from a wafer, comprising:
a channel for receiving the wafer, the channel defined to include a solid constraining surface positioned in an opposing and substantially parallel orientation with respect to a surface of the wafer, wherein contaminants are to be removed from the surface of the wafer;
a liquid cleaning material disposed within the channel such that the wafer to be received by the channel is submerged within the liquid cleaning material;
a plurality of solid components dispersed within the liquid cleaning material, wherein each of the plurality of solid components is defined to deform when pressed against a contaminant on the surface of the wafer such that a mechanical linkage is established between the solid component and the contaminant so as to bind the contaminant to the solid component; and
an immiscible component generator disposed within the channel to generate immiscible components within the liquid cleaning material such that a motive force is applied to move the immiscible components between the solid constraining surface of the channel and the surface of the wafer,
wherein the solid constraining surface is defined to constrain a position of the immiscible components relative to the wafer, such that the immiscible components press at least some of the plurality of solid components against contaminants present on the surface of the wafer as the immiscible components move between the solid constraining surface and the surface of the wafer.

14. An system for removing contamination from a wafer as recited in claim 13, further comprising:
a cleaning material circulator defined to induce a flow within the liquid cleaning material.

15. An system for removing contamination from a wafer as recited in claim 13, wherein the channel is defined to be positioned at an angle greater than zero with respect to horizontal such that the motive force for moving the immiscible components is a buoyant force.

16. An system for removing contamination from a wafer as recited in claim 13, wherein the channel is defined to enable adjustment of a separation distance between the solid constraining surface of the channel and the surface of the wafer.

17. An system for removing contamination from a wafer as recited in claim 13, further comprising:
a cleaning material control system defined to monitor and adjust a chemistry of the liquid cleaning material to enhance interaction between the plurality of solid components and the contaminants present on the surface of the wafer.

18. An system for removing contamination from a wafer as recited in claim 13, further comprising:
a temperature control system defined to control a temperature of the liquid cleaning material within the channel.

19. An system for removing contamination from a wafer as recited in claim 13, further comprising:
a wafer holder defined to either rotate, translate, or both rotate and translate the wafer within the channel.

20. An system for removing contamination from a wafer as recited in claim 13, wherein the system is defined to remove contamination from multiple wafers in a simultaneous manner.

* * * * *